US009910087B2

(12) United States Patent  
Eagen et al.

(10) Patent No.: US 9,910,087 B2  
(45) Date of Patent: Mar. 6, 2018

(54) INTEGRATED CIRCUIT AND METHOD FOR DETECTING A STRESS CONDITION IN THE INTEGRATED CIRCUIT

(71) Applicant: Allegro Microsystems, LLC, Worcester, MA (US)

(72) Inventors: Jeffrey Eagen, Manchester, NH (US); Maxim Klebanov, Newton, MA (US); William P. Taylor, Amherst, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 29 days.

(21) Appl. No.: 15/068,775

(22) Filed: Mar. 14, 2016

(65) Prior Publication Data

US 2017/0261546 A1    Sep. 14, 2017

(51) Int. Cl.
*G01R 31/28* (2006.01)
*G01L 1/12* (2006.01)
*G01D 3/08* (2006.01)
*G01D 5/14* (2006.01)
*G01D 5/244* (2006.01)
*G01R 33/09* (2006.01)

(52) U.S. Cl.
CPC ........... *G01R 31/2872* (2013.01); *G01D 3/08* (2013.01); *G01D 5/145* (2013.01); *G01D 5/24428* (2013.01); *G01L 1/12* (2013.01); *G01R 33/09* (2013.01)

(58) Field of Classification Search
CPC combination set(s) only.
See application file for complete search history.

(56) References Cited

U.S. PATENT DOCUMENTS

| 6,014,023 A * | 1/2000 | Yokotani | G01R 33/09 324/207.21 |
|---|---|---|---|
| 7,777,607 B2 | 8/2010 | Taylor et al. | |
| 7,923,996 B2 | 4/2011 | Doogue et al. | |
| 8,030,918 B2 | 10/2011 | Doogue et al. | |
| 8,624,588 B2 | 1/2014 | Vig et al. | |
| 9,322,887 B1 | 4/2016 | Eagen et al. | |
| 2002/0175680 A1 * | 11/2002 | Heremans | G01R 33/09 324/252 |
| 2003/0006764 A1 * | 1/2003 | Kou | B82Y 25/00 324/252 |

(Continued)

OTHER PUBLICATIONS

Application as filed on Dec. 1, 2014 for U.S. Appl. No. 14/556,523, 40 pages.

(Continued)

*Primary Examiner* — Clayton E Laballe
*Assistant Examiner* — Jas Sanghera
(74) *Attorney, Agent, or Firm* — Daly, Crowley, Mofford & Durkee, LLP

(57) ABSTRACT

An integrated circuit includes at least one first magnetic field sensing element including at least one first magnetoresistance element configured to provide an output signal of the integrated circuit in response to a detected magnetic field. The integrated circuit also includes at least one second magnetic field sensing element including at least one second magnetoresistance element configured to have a characteristic indicative of a stress condition. A method for detecting a stress condition in an integrated circuit is also provided.

24 Claims, 7 Drawing Sheets

(56) References Cited

U.S. PATENT DOCUMENTS

| | | | |
|---|---|---|---|
| 2004/0154410 A1* | 8/2004 | Kondo | B62D 15/02 |
| | | | 73/862.23 |
| 2007/0170533 A1* | 7/2007 | Doogue | B82Y 25/00 |
| | | | 257/422 |
| 2011/0270553 A1* | 11/2011 | Ausserlechner | G01R 15/202 |
| | | | 702/64 |
| 2013/0099777 A1* | 4/2013 | Heberle | G01B 7/14 |
| | | | 324/207.2 |
| 2013/0200909 A1 | 8/2013 | Rasbornig et al. | |
| 2013/0265038 A1* | 10/2013 | Ide | B82Y 25/00 |
| | | | 324/249 |
| 2014/0177674 A1 | 6/2014 | Drouin et al. | |
| 2015/0323612 A1 | 11/2015 | Latham | |
| 2016/0313413 A1* | 10/2016 | Mohan | G01R 33/098 |

OTHER PUBLICATIONS

Application as filed on Jan. 20, 2015 for U.S. Appl. No. 14/600,826, 35 pages.

PCT Article 19 Amendment filed Jul. 31, 2017 for PCT Application No. PCT/US2017/020904; 12 pages.

Search Report and Written Opinion dated Jun. 9, 2017 for PCT Application No. PCT/US2017/020904, 15 pages.

* cited by examiner

INTEGRATED CIRCUIT AND METHOD FOR DETECTING A STRESS CONDITION IN THE INTEGRATED CIRCUIT

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuits, and more particularly, to an integrated circuit and a method capable of detecting a stress condition in the integrated circuit.

BACKGROUND

As is known, integrated circuits (circuits in which all components, passive and active, are integrated on one or more substrates) are used in a variety of applications. One example application is in sensing applications in which a circuit including one or more sensing elements (e.g., pressure sensing elements, temperature sensing elements, light sensing elements, acoustic sensing elements, and magnetic field sensing elements) is used to detect one or more parameters (e.g., pressure, temperature, light, sound, magnetic field). Magnetic field sensors, for example, are circuits including one or more magnetic field sensing elements, generally in combination with other circuit components (e.g., analog, digital and/or mixed signal components), and are used to detect a magnetic field.

In motion (e.g., rotation) detectors, for example, a magnetic field sensor may be used to detect motion of an object, such as a ferromagnetic object, for example, a gear or ring magnet. A magnetic field associated with the object is typically detected by one or more magnetic field sensing elements, such as Hall effect elements and or magnetoresistance elements, which provide a signal (i.e., a magnetic field signal) proportional to a detected magnetic field. One example motion detector is described in U.S. Pat. No. 8,624,588 entitled "Apparatus and Method for Providing an Output Signal Indicative of a Speed of Rotation and a Direction of Rotation as a Ferromagnetic Object," which is assigned to the assignee of the present disclosure and incorporated herein by reference in its entirety.

Magnetic field sensing elements and other circuitry typically have associated operational ratings and limits, or ranges of operation, such as those pertaining to temperature and magnetic field exposure. Exposure to certain conditions beyond a component's specified rating (i.e., stress conditions) during shipping, storage, and/or use may, for example, adversely affect operation of the magnetic field sensing elements and or circuitry and, thus, the reliability of a resulting device (e.g., motion detector) in which the magnetic field sensing elements and/or circuitry are provided. Whether exposure to conditions outside of a device's specified operating range damages the device depends on several factors such as the duration and/or extent of the exposure.

In high precision applications such as automobiles, accuracy in magnetic field sensing, such as may be used to detect motion of a target object, can be critical. Engine ignition timing, for example, depends on consistent detection accuracy. As one example, when magnetic field sensing elements and/or other circuitry of a magnetic field sensor integrated circuit (IC) in an engine ignition timing system are damaged due to overstress conditions, detection accuracy by the magnetic field sensor IC, and the resulting accuracy or performance of the engine ignition timing system, can be negatively impacted. Furthermore, in safety critical applications such as automobiles, compliance with standards such as Automotive Safety Integrity Level (ASIL) standards, generally requires safety mechanisms to ensure accurate and reliable circuit operation.

SUMMARY

Described herein are concepts, systems, circuits and techniques related to an integrated circuit and a method capable of detecting a stress condition (e.g., over temperature condition and/or exposure to a magnetic field strength greater than a predetermined level) in the integrated circuit.

The described integrated circuit and method can determine whether the integrated circuit and its associated circuit components (e.g., GMR elements) are being used within specified limits (or stress limits) of the integrated circuit and/or circuit components. The described integrated circuit and method can also provide an indication of a detected stress condition, if present, through one or more indictors (e.g., an output voltage signal and/or a comparison signal indicative of the stress condition).

In one aspect of the concepts described herein, an integrated circuit includes at least one first magnetic field sensing element. The at least one first magnetic field sensing element includes at least one first magnetoresistance element configured to provide an output signal of the integrated circuit in response to a detected magnetic field. The integrated circuit also includes at least one second magnetic field sensing element. The at least one second magnetic field sensing element includes at least one second magnetoresistance element (e.g., a stress detecting magnetoresistance element) configured to have a characteristic indicative of a stress condition.

The integrated circuit may include one or more of the following features individually or in combination with other features. The at least one first magnetoresistance element may be supported by a same semiconductor substrate as the at least one second magnetoresistance element. The at least one first magnetoresistance element may be supported by a different semiconductor substrate than the at least one second magnetoresistance element. A first resistance of the at least one second magnetoresistance element measured at a first time may be compared to a second resistance of the at least one second magnetoresistance element measured at a second time to detect the stress condition. A first resistance of the at least one second magnetoresistance element measured at a first time may be compared to a baseline resistance associated with the at least one second magnetoresistance element to detect the stress condition. The at least one second magnetoresistance element may be provided in a resistor divider. The integrated circuit may include a comparator responsive to a node of the resistor divider and to a reference signal to generate a comparison signal indicative of the stress condition.

The stress condition may be at least one of an over temperature condition or an exposure to a magnetic field greater than a predetermined level. The stress condition may be detected as at least one of an offset or a change in a peak-to-peak range of a characteristic curve associated with the at least one second magnetoresistance element. The at least one second magnetoresistance element may include a plurality of magnetoresistance elements coupled in a bridge configuration.

The integrated circuit may include an amplifier responsive to a first output voltage generated at a first voltage node of a bridge configuration and to a second output voltage generated at a second voltage node of the bridge configuration to generate an output signal indicative of a voltage difference between the first output voltage and the second output voltage. The first and second output voltages may change in response to a magnetic field. The integrated circuit may include a comparator responsive to the output signal of the amplifier and a reference signal to generate a comparison signal indicative of the stress condition.

The integrated circuit may include a current source and a conductive trace disposed proximate to one or more of the plurality of magnetoresistance elements, and configured to carry a current signal generated by the current source to provide a magnetic field. One or more of the plurality of magnetoresistance elements may be insensitive to a magnetic field. The at least one first magnetic field sensing element may include at least one Hall effect element. The at least one second magnetoresistance element may include one or more of a giant magnetoresistance (GMR) element, an anisotropic magnetoresistance (AMR) element, a magnetic tunnel junction (MTJ) element and a tunneling magnetoresistance (TMR) element. The plurality of magnetoresistance elements may have a temperature coefficient that is substantially the same.

In another aspect of the concepts described herein, a method for detecting a stress condition in an integrated circuit includes providing at least one first magnetic field sensing element as may be provided in the form of a magnetoresistance element configured to provide an output signal of the integrated circuit in response to a detected magnetic field. The method also includes providing at least one second magnetic field sensing element as may be provided in the form of a magnetoresistance element detecting the stress condition based on based on a characteristic of the at least one second magnetic field sensing element.

The method may include one or more of the following features either individually or in combination with other features. Detecting the stress condition may include measuring a first resistance of the at least one second magnetoresistance element at a first time, measuring a second resistance of the at least one second magnetoresistance element at a second time, and comparing the first resistance with the second resistance to detect the stress condition. Detecting the stress condition may include measuring a first resistance of the at least one second magnetoresistance element at a first time and comparing the first resistance with a baseline resistance associated with the at least one second magnetoresistance element to detect the stress condition.

Providing at least one second magnetic field sensing element may include providing a plurality of magnetoresistance elements coupled in a bridge configuration, receiving a first output voltage generated at a first voltage node of the bridge configuration, and receiving a second output voltage generated at a second voltage node of the bridge configuration. Providing the at least one second magnetic field sensing may include generating an amplifier output signal indicative of a voltage difference between the first and second output voltages. The first and second output voltages may change in response to the magnetic field. Providing the at least one second magnetic field sensing element may include generating a comparison signal indicative of the stress condition in response a comparison of the amplifier output signal and a reference signal.

Providing a plurality of magnetoresistance elements may include providing at least one magnetoresistance element with a resistance that does not vary with magnetic field. Providing the at least one second magnetic field sensing element may include providing a conductive trace to generate the magnetic field.

BRIEF DESCRIPTION OF THE DRAWINGS

The foregoing features of the disclosure, as well as the disclosure itself may be more fully understood from the following detailed description of the drawings, in which.

DETAILED DESCRIPTION

Figure 1:
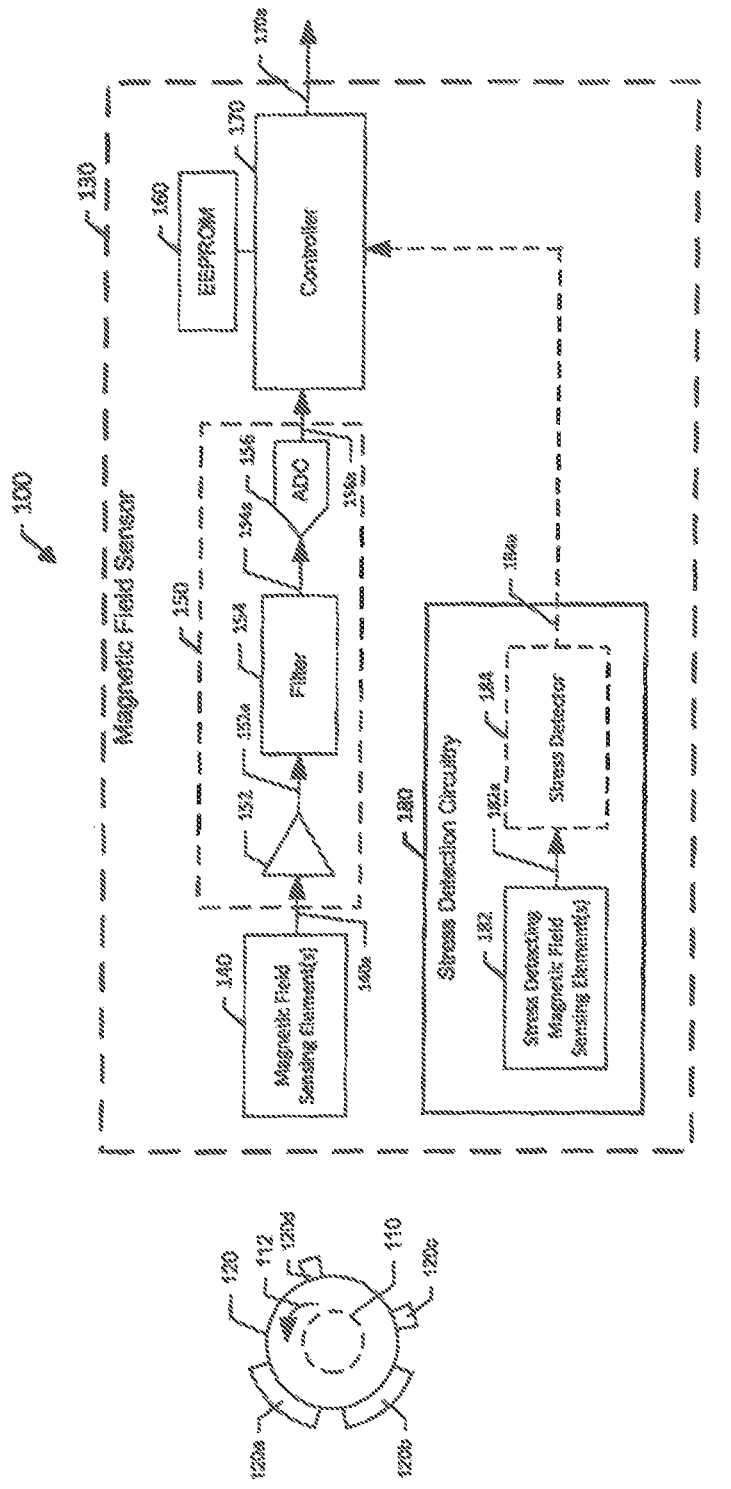
FIG. 1 is a block diagram of an example integrated circuit including stress detection circuitry.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

As used herein, the term "motion" is used to describe a variety of types of movement associated with an object, for example, including rotational movement (or "rotation") and linear (or "rectilinear") movement of the object. A "motion detector" may, for example, detect rotation of an object. A "rotation detector" is a particular type of "motion detector."

While integrated circuits comprising so-called "first" and "second" magnetic field sensing elements which include at least one first magnetoresistance element and at least one second magnetoresistance element, respectively, are described in several examples below, the at least one first magnetoresistance element and at least one second magnetoresistance element are discussed to promote simplicity, clarity and understanding in the description of the concepts, systems, circuits and techniques sought to be protected herein and is not intended to be, and should not be construed as, limiting. In some embodiments, the "first" and "second" magnetic field sensing elements described herein may include other types of magnetic field sensing elements (e.g., Hall effect elements) in addition to the at least one first magnetoresistance element and at least one second magnetoresistance element. For example, the first magnetic field sensing elements could include one or more Hall effect elements and magnetic field stress detecting magnetoresistance elements could be used to detect whether the Hall effect elements are being used within datasheet limits (e.g., based on a stress condition detected by the magnetic field stress detecting magnetoresistance elements).

Additionally, while integrated circuits (ICs) including magnetoresistance elements (e.g., GMR elements) which are the same as or similar to each other are described in several examples below, such are discussed to promote simplicity, clarity and understanding in the drawings as well as in the written description of the broad concepts, systems, circuits and techniques sought to be protected herein and are not intended to be, and should not be construed, as limiting. The concepts, systems, circuits and techniques disclosed herein may, of course, be implemented using magnetoresistance elements which are different from each other.

Further, it should be appreciated that, as used herein, relational terms, such as "first," "second," "top," "bottom," "left," "right," and the like, may be used to distinguish one element or portion(s) of an element from another element or portion(s) of the element without necessarily requiring or implying any physical or logical relationship or order between such elements.

Referring now to FIG. 1, an example integrated circuit (IC) 100 which is capable of detecting a stress condition (e.g., a stress condition associated with at least one magnetic field sensing element 140 supported by the substrate) is shown to include at least one first magnetic field sensing element 140 configured to provide an output signal 170a of the IC 100 in response to a detected magnetic field and at least one second magnetic field sensing element 182 configured to have a characteristic indicative of a stress condition.

The IC 100, which may be provided in the form of a magnetic field sensor IC 130 (e.g., a motion detector) in some embodiments, includes a signal path 150 (e.g., an analog, digital or mixed signal path) in the illustrated embodiment. The IC 100 also includes a memory device 160 (e.g., EEPROM) or flash memory, a controller 170, and stress detection circuitry 180. The signal path 150 has an input coupled to an output of the magnetic field sensing element(s) 140, and an output coupled to a corresponding input of the controller 170. Additionally, the stress detection circuitry 180, which includes at least one stress detecting magnetoresistance element 182, as will be discussed, has an output coupled to a corresponding input of the controller 170.

The at least one first magnetic field sensing element 140 may be driven by a current and/or voltage source (not shown) and include at least one first magnetoresistance element (e.g., a GMR element) supported by a semiconductor substrate. The first magnetic field sensing element(s) 140 may include at least one other type of magnetic field sensing element (e.g., Hall effect element) in addition to the at least one first magnetoresistance element in some embodiments. The other type of magnetic field sensing element may also be supported by the semiconductor substrate (i.e., a same semiconductor substrate) and configured to generate a magnetic field signal (e.g., magnetic field signal 140a) in response to the detected magnetic field.

The detected magnetic field may be generated in various ways depending on the type of IC 100 and its application. For example, the detected magnetic field may be generated in response to motion of an object 120 (e.g., a ring magnet or ferromagnetic gear) having features, e.g., magnetic domains or gear teeth 120a, 120b, 120c, 120d. For example the object 120 can be disposed a shaft 110 (e.g., a steering shaft or a camshaft) configured to rotate in a direction 112. The object 120 may also be coupled to an automobile wheel, as another example. The detected magnetic field may be generated by a magnet (not shown) disposed proximate to or within the IC 100. With such a back-biased magnet configuration, motion of the object 120 can result in variations of the magnetic field sensed by the first magnetic field sensing element(s) 140 and, thus, result in variations of the magnetic field signal 140a. It should be appreciated that the first magnetic field sensing element(s) 140 may take any form and configuration suitable for detecting motion (e.g., speed of motion and/or direction of motion) of the object 120 by sensing a magnetic field affected by such motion.

The detected magnetic field may also be a local and/or external magnetic field which may be generated by one or more sources (e.g., object 120 or a current carrying conductor) during a testing routine. The local or external magnetic field may, for example, be ramped through a predetermined range of magnetic field strengths or may have a predetermined magnetic field strength to test the IC 100. In the case of a current sensor IC, the detected magnetic field may be generated by a current carried by a conductive trace or conductor. Additionally, in the case of a linear magnetic field sensor, an ambient, external magnetic field can be detected and a dedicated magnetic field source, such as a ring magnet or back-biased magnet, may be omitted.

The signal path 150, which includes an amplifier 152, a filter 154 and an analog-to-digital converter (ADC) 156 in the illustrated embodiment, is coupled to receive the magnetic field signal 140a at an input and configured to generate a signal (e.g., digital signal 156a) representative of the magnetic field signal 140a at an output. In particular, the amplifier 152 is coupled to receive the magnetic field signal 140a and configured to generate an amplified signal 152a. Additionally, the filter 154 (e.g., a programmable analog filter) is coupled to receive the amplified signal 152a and configured to generate a filtered signal 154a. Further, the ADC 156 is coupled to receive the filtered signal 154a and configured to generate a corresponding digital signal 156a. The digital signal 156a is provided to a corresponding input of controller 170.

The stress detection circuitry 180 includes one or more second magnetic field sensing elements 182 and a stress detector 184 in the illustrated embodiment. The second magnetic field sensing element(s) 182 may be driven by a current and/or voltage source (not shown), or not be driven by any current and/or voltage sources (i.e., be unpowered), and include at least one second magnetoresistance element (e.g., a GMR element) supported by a semiconductor substrate. The semiconductor substrate supporting the second elements 182 may be the same semiconductor substrate that supports the first magnetic field sensing element(s) 140 in some embodiments, and a different semiconductor substrate in other embodiments. When a different semiconductor substrate, the substrate supporting the second magnetoresistance element(s) (e.g., a second semiconductor substrate) may be configured to be electrically coupled to and decoupled from the semiconductor substrate supporting the first magnetic field sensing element(s) 140 and, thus, may occupy substantially no space on the first semiconductor substrate (e.g., other than connections as may be required for coupling and decoupling for analyzing the second magnetoresistance element for stress conditions). Further, in some embodiments, the second magnetic field sensing element(s) 182 may include another type of magnetic field sensing element (e.g., Hall effect element) in addition to the at least one second magnetoresistance element(s) 182.

The at least one second magnetoresistance element 182, which is a magnetic field stress detecting magnetoresistance element, may be configured to have a characteristic (e.g., a response characteristic) indicative of a stress condition, and can be provided as a stress detecting magnetoresistance element to detect the stress condition (e.g., before a failure condition occurs). The stress detector 184 and its output signal 184a are shown with dotted lines to illustrate that in the some embodiments, these features can be external to the IC 100, as will be described.

The stress condition may, for example, be at least one of an over temperature condition or an exposure to a magnetic field having a strength greater than a predetermined level, as may be established by predetermined specified limits associated with the at least one second magnetoresistance element 182. The stress condition may also include an electrostatic discharge (ESD) event or mechanical stress. Detection of a stress condition by the at least one second magnetoresistance element 182 may also be indicative of a stress condition associated with the first magnetic field sensing elements 140 and/or other circuit elements of the IC 100.

In some embodiments, the at least one second magnetoresistance element 182 may be responsive to the detected magnetic field to generate a magnetic field signal 182a, which signal may be indicative of the stress condition. In other embodiments, the at least one second magnetic field sensing element 182 may be responsive to an applied magnetic field that is different than the detected magnetic field to which the sensing element(s) 140 respond during operation of the IC 100. In some embodiments, the at least one second magnetoresistance element may include one or more of a giant magnetoresistance (GMR) element, a magnetic tunnel junction (MTJ) element and a tunneling magnetoresistance (TMR) element. Additionally, in some embodiments, the at least one second magnetoresistance element may be the same as or similar to the at least one first magnetoresistance element 140. For example, it may be desirable to construct the at least one second magnetoresistance element 182 in a manner designed to cause the at least one second magnetoresistance element 182 to be detect a stress condition before the at least one first element 140 experiences a stress condition. In embodiments in which the at least one first element 140 is provided as an anisotropic magnetoresistance (AMR) element, for example, the at least one second magnetoresistance element 182 may also be provided an AMR element.

With the above-described arrangement, stress detection by the at least one second magnetoresistance element 182 can be reported and acted upon so as to prevent the IC 100 from providing an erroneous output signal, such as by shutting down or providing a warning or fault indication of the IC 100 once the stress condition is detected.

Figure 4:
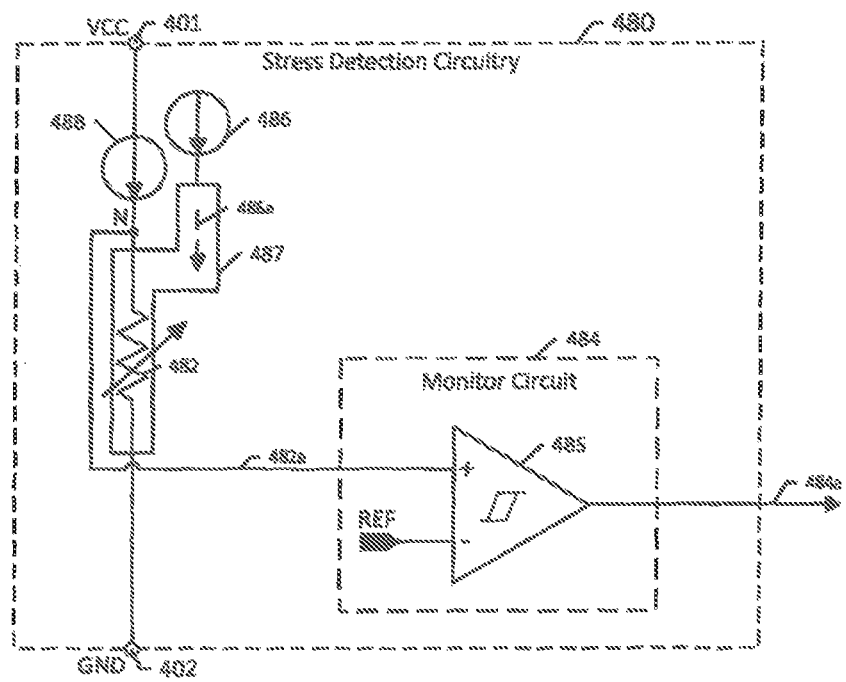
FIG. 4 shows a first example configuration of stress detection circuitry as may be provided on an integrated circuit.
Figure 4A:
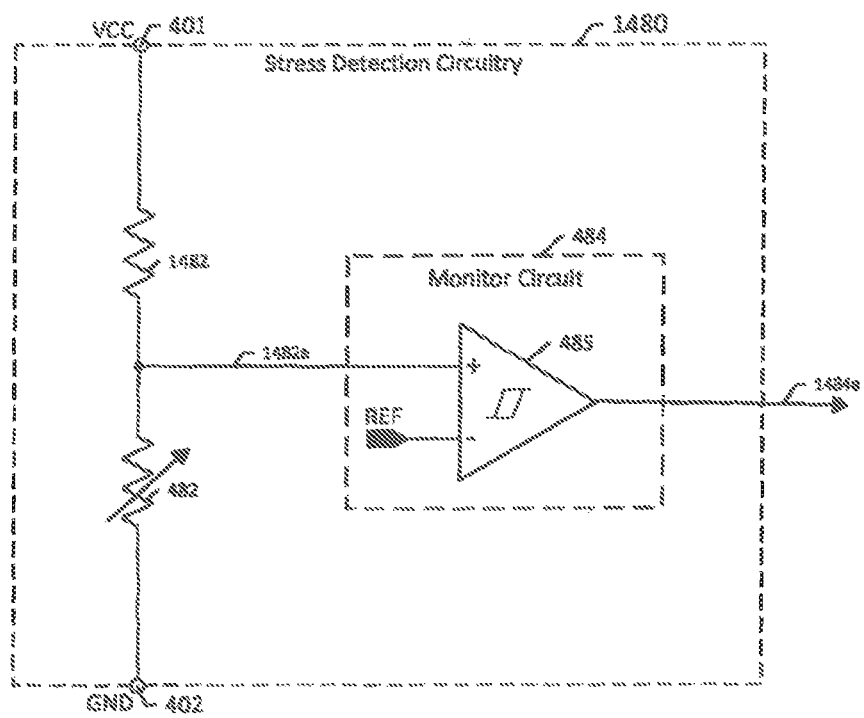
FIG. 4A shows a second example configuration of stress detection circuitry as may be provided on an integrated circuit.
Figure 4B:
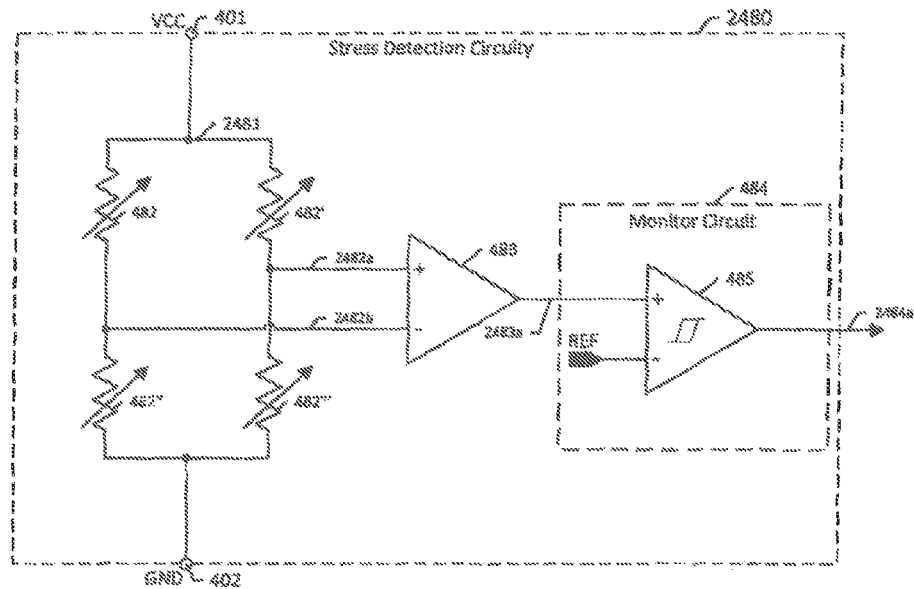
FIG. 4B shows a third example configuration of stress detection circuitry as may be provided on an integrated circuit.
Figure 4C:
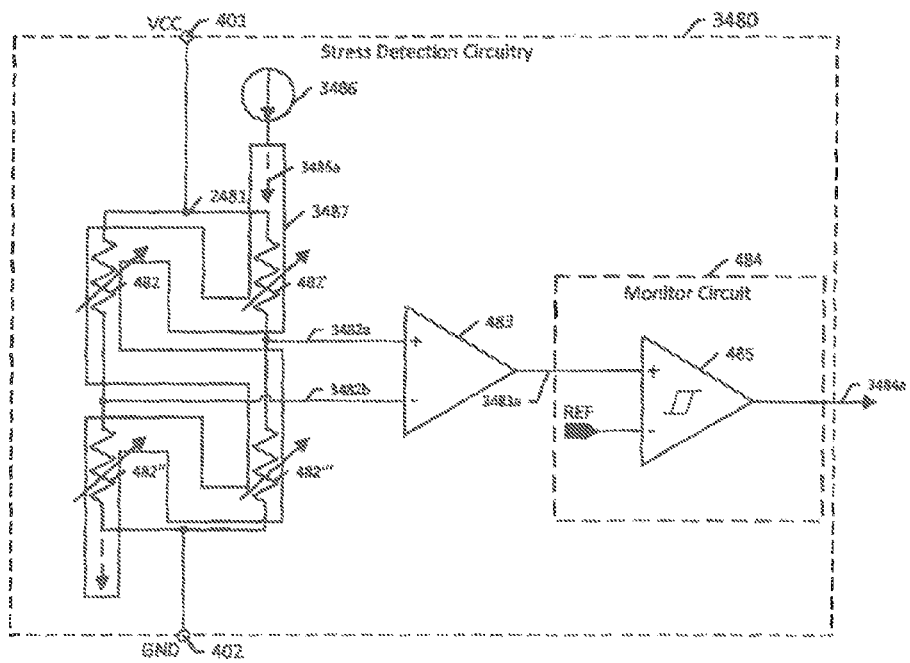
FIG. 4C shows a fourth example configuration of stress detection circuitry as may be provided on an integrated circuit.
Figure 4D:
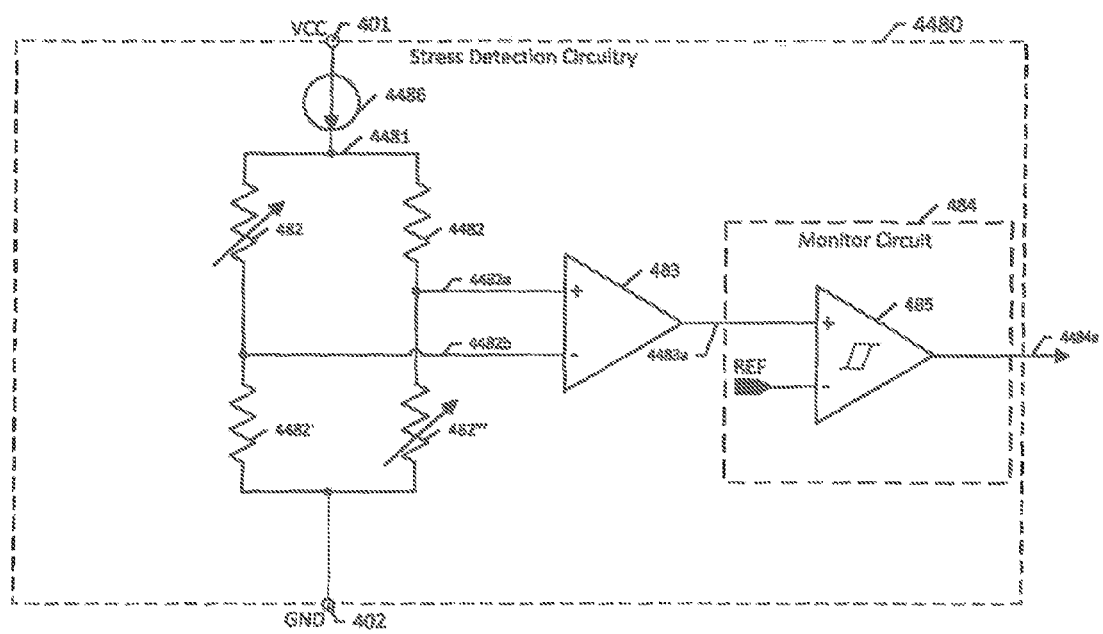
FIG. 4D is shows a fifth example configuration of stress detection circuitry as may be provided on an integrated circuit.

The stress detector 184, which may include an amplifier and/or a comparator, for example, as discussed further below in conjunction with FIGS. 4-4D, is coupled to receive the magnetic field signal 182a at an input and configured to generate a stress detection signal 184a indicative of the stress condition at an output. The stress detection signal 184a is provided to a corresponding input of controller 170. Although the stress detection circuitry 180 is provided in a separate signal path from the first magnetic field sensing element(s) 140 in the illustrated embodiment, in other embodiments the stress detection circuitry 180 may be provided in a same signal path as the first magnetic field sensing element(s) 140. Further, the stress detection circuitry 180 may be placed in series or in parallel with the first magnetic field sensing element(s) 140 to detect the stress condition.

The controller 170 (e.g., a synchronous digital controller or an analog controller), which may include diagnostic circuitry and/or software, for example, is coupled to receive at least the digital signal 156a (or a comparable analog signal when the controller 170 is an analog controller) and the stress detection signal 184a at respective inputs and configured to generate a controller output signal 170a at an output of the IC 100. The controller output signal 170a may be provided as a signal indicative of the magnetic field signal 140a or the stress detection signal 184a. The controller output signal 170a may also be provided as a signal indicative of the magnetic field signal 140a and the stress detection signal 184a. In some embodiments, the controller output signal 170a may be received by circuitry (e.g., analog, digital or mixed-signal circuitry) (not shown) for further processing (e.g., for generating filtered signals, amplified signals, and the like) and stress reporting (e.g., to an engine control unit or ECU).

Additionally, in some embodiments, the controller 170 may be configured to poll (i.e., sample) the stress detection circuitry 180 through use of one or more algorithms in the controller 170 and use data obtained from the polling to determine if a stress condition (or failure) has occurred. A result of the determination, as may have a corresponding stress condition or failure code, for example, may be saved in the memory device 160, provided in the controller output signal 170a, and/or displayed on a visual indicator (e.g., LED) as a few examples.

Further, in some embodiments, the controller 170 may contain or be coupled to circuitry configured to generate signals (e.g., motion detection output signals) indicative of one or more of a speed of motion of the object 120 or a direction of motion of the object 120. One such circuit is described in co-pending U.S. patent application Ser. No. 14/600,826 entitled "Methods And Apparatus For Generating A Threshold Signal In A Magnetic Field Sensor," which is assigned to the Assignee of the present disclosure and incorporated herein by reference in its entirety.

While the IC 100 may be provided in the illustrated form of an integrated circuit with an analog front end portion and a digital portion, it will be appreciated that the particular delineation of which circuit functions are implemented in an analog fashion or with digital circuitry and signals can be varied. For example, one or more portions of the signal path 150 (e.g., amplifier 152, filter 154, ADC 156) may be provided as part of the controller 170. The controller 170 can, for example, perform the function, operation, or sequence of operations of one or more portions of the signal path 150. Additionally, the memory device 160 can be provided as part of the controller 170 (e.g., as onboard EEPROM). Further, some of the illustrated circuit functions can be implemented on separate circuits (e.g., additional substrates within the same integrated circuit package, or additional integrated circuit packages, and/or on circuit boards). Additionally, in one embodiment, one or more of the second magnetic field sensing element(s) 182 may be coupled in series or in parallel with the first magnetic field sensing element(s) 140. In such embodiment, the first magnetic field sensing element(s) 140 may, for example, be used in conjunction with the second magnetic field sensing element(s) 182 to detect the stress condition.

In accordance with the concepts, systems, circuits, and techniques sought to be protected herein, by providing the stress detection circuitry 180 within the IC 100, the IC 100 is capable of detecting a stress condition associated the IC 100. It should be appreciated that IC 100 is but one configuration of an IC in accordance with the disclosure. IC's including stress detection circuitry (e.g., 180) may also be found suitable in other applications (e.g., other sensing applications) besides magnetic field sensing and/or motion detection applications.

Figure 2:
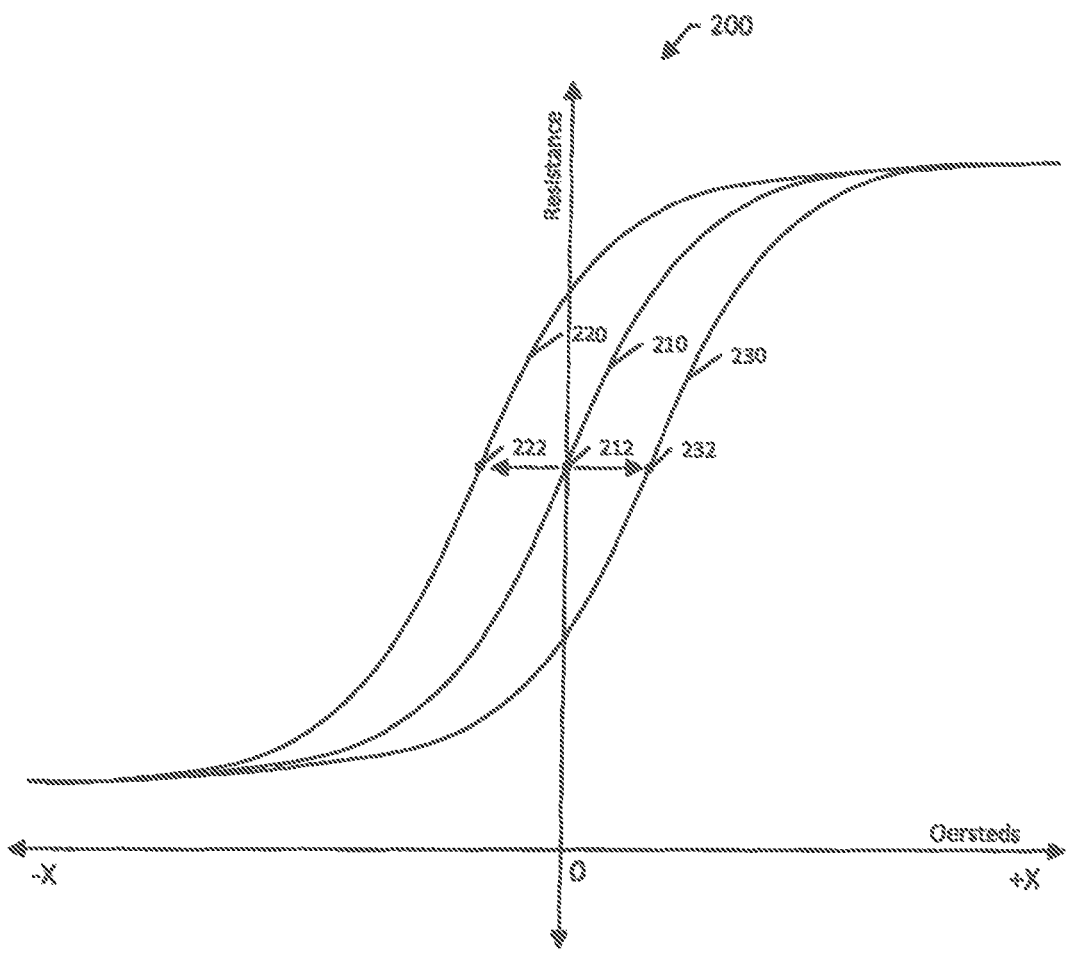
FIG. 2 shows illustrative characteristic curves associated with a stress detecting magnetoresistance element.
Figure 2A:
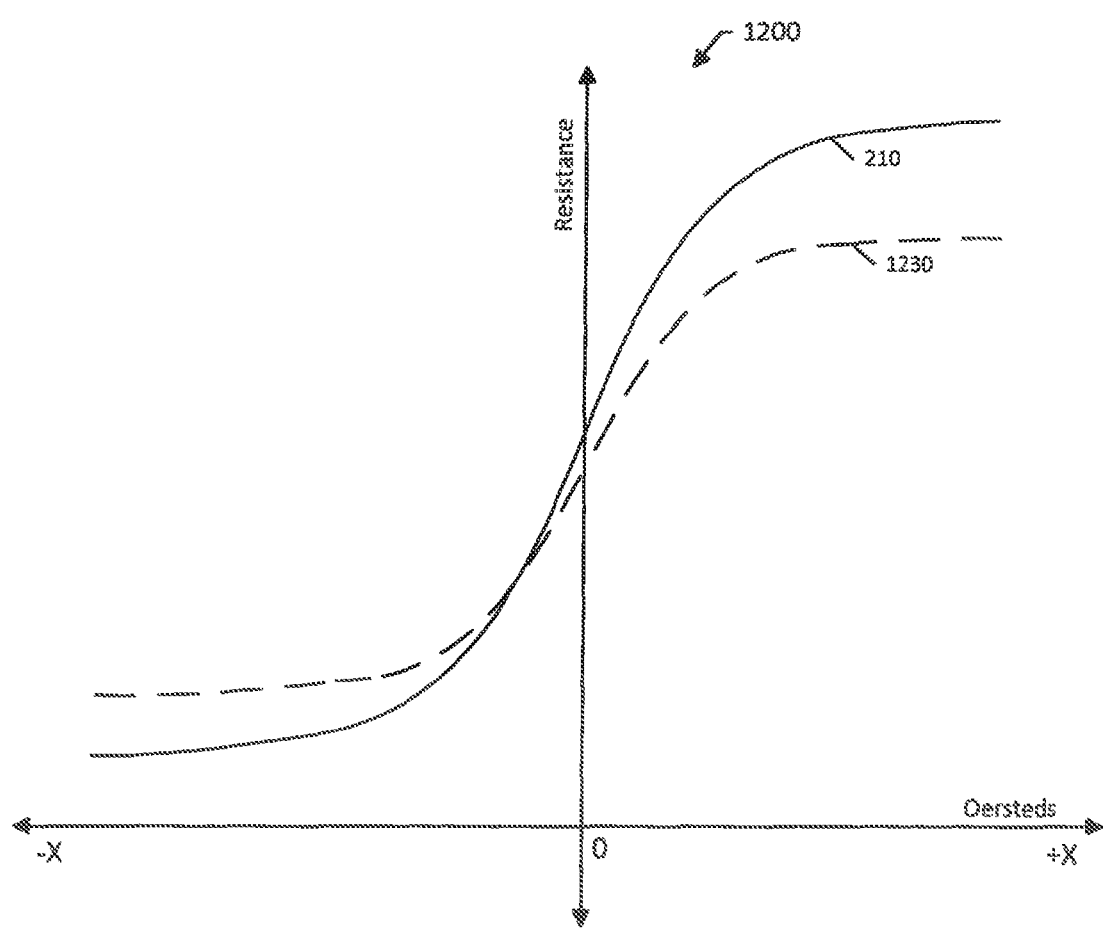
FIG. 2A shows illustrative characteristic curves associated with a stress detecting magnetoresistance element.

Referring to FIGS. 2-2A, illustrative characteristic curves as may be representative of various response characteristics of a stress detecting magnetoresistance element, which can be the same as or similar to the at least one second magnetoresistance element 182 described above in conjunction with FIG. 1, are shown in plots 200 and 1200. The plots have a horizontal axis with a scale in applied magnetic field strength units (e.g., Oersted) and a vertical axis with a scale in resistance units (e.g., ohms). Positive magnetic field strength units (e.g., +X) may correspond to a magnetic field experienced by the magnetoresistance element in a first direction, such as in response to a first direction of motion (e.g., rotation) by an object (e.g., 120, shown in FIG. 1). Additionally, negative magnetic field strength units (e.g., −X) may correspond to a magnetic field experienced by the magnetoresistance element in a second, opposite direction, such as in response to a second direction of motion by the object.

Each of FIGS. 2-2A shows a characteristic curve (e.g., 210, shown in FIG. 2) representative of an example response characteristic of a stress detecting magnetoresistance element which does not have a characteristic indicative of a stress condition. In other words, the magnetoresistance element having this response characteristic has either not been or has minimally been exposed to a stress condition. The magnetoresistance element may have also recovered from a stress condition (e.g., a temporary stress condition resulting from a substantially large magnetic field at about room temperature). Such magnetoresistance element may, for example, be representative of a baseline magnetoresistance element (e.g., an ideal magnetoresistance element) which other magnetoresistance elements are compared against to detect a stress condition. Each of FIGS. 2-2A also shows curves (e.g., 220 and 230, shown in FIG. 2) representative of example response characteristics of stress detecting magnetoresistance element(s) having a characteristic indicative of a stress condition.

Referring to FIG. 2, a plot 200 includes a characteristic curve 210 representative of a first response characteristic of a magnetoresistance element, a curve 220 representative of a second response characteristic of a magnetoresistance element, and a curve 230 representative of a third response characteristic of a magnetoresistance element. In some embodiments, the magnetoresistance elements characterized by curves 210, 220, 230 may be the same magnetoresistance element with the response characteristics corresponding to response characteristics of the magnetoresistance element at various points in time under different operating conditions (e.g., temperature and/or magnetic field strength). In other embodiments, the magnetoresistance elements may be different magnetoresistance elements (e.g., a baseline magnetoresistance element and one or more magnetoresistance elements subjected to a stress condition). For simplicity of the discussions herein, the former (i.e., a same magnetoresistance element) will be assumed.

As illustrated, the resistance of the magnetoresistance element characterized by curves 210, 220, 230 generally changes in response to changes in a magnetic field strength experienced by the magnetoresistance element, except for when the magnetoresistance element is in so-called saturation regions in which the resistance of the magnetoresistance element (and curves 210, 220, 230) substantially levels off. In a first one of the saturation regions, in which the magnetic field has a negative magnetic field strength (e.g., −X), the magnetoresistance element has a minimum resistance (or a minimum resistance range). Additionally, in a second one of the saturation regions, in which the magnetic field has a positive magnetic field strength (e.g., +X), the magnetoresistance element has a maximum resistance (or a maximum resistance range).

As is also illustrated, when the magnetoresistance element is subjected to substantially no magnetic field (i.e., a magnetic field with a strength of about zero Gauss), as represented by the intersection of the vertical axis with the horizontal axis of plot 200, the resistance of the magnetoresistance element may be a value between that of the saturation regions. In the example embodiment shown, curve 210, which may correspond to a response characteristic of the magnetoresistance element at a first time (e.g., a predetermined time prior to use or shipment of the magnetoresistance element), has resistance indicated by point 212 at a magnetic field of about zero. The resistance may correspond to a first resistance of the magnetoresistance element measured at the first time, or a baseline resistance of the magnetoresistance element.

Curves 220 and 230, which may correspond to response characteristics of the magnetoresistance element at a second time (e.g., a predetermined time after shipment or use of the magnetoresistance element) under different operating conditions, are horizontally offset with respect to curve 210, as indicated by points 222 and 232. As a result of this offset, the magnetoresistance element characterized by curve 220 has a resistance which is greater than the resistance indicated by point 212 at a magnetic field of about zero. Additionally, the magnetoresistance element characterized by curve 230 has a resistance which is less than the resistance indicated by point 212 at a magnetic field about zero. These resistances may correspond to second resistances of the magnetoresistance element measured at second respective times under different operating conditions. The first resistance may be compared to at least one of the second resistances to detect a stress condition. The stress condition may be at least one of an over temperature condition or an exposure to a magnetic field having a strength greater than a predetermined level.

As is known, magnetoresistance elements are typically sensitive to magnetic fields and temperature. In some embodiments, the horizontal offset of curves 220, 230 relative to curve 210 can be the result of temperature excursions which results in a change in a response of the magnetoresistance elements at room temperature and/or magnetic field strength variation. For example, characteristic curve 220 can be associated with magnetoresistance element exposed to a first temperature and characteristic curve 230 can be associated with the magnetoresistance element exposed to a second temperature which may be higher than the first temperature for example. As is also known, a magnetoresistance element's response to a magnetic field is a function of various factors including design parameters, such as materials, layer thickness and other dimensions, etc.

In embodiments in which the resistance indicated by point 212 corresponds to a baseline resistance of the magnetoresistance element, the above-described resistances of the magnetoresistance element characterized by curves 220 and 230 may correspond to resistances of the magnetoresistance element measured at respective times, and the baseline resistance may be compared to at least one of the these resistances to detect a stress condition. The stress condition may also be detected as an offset of the curves 220, 230 with respect to the curve 210. As one example, the stress condition may be detected as an offset of points 222, 232 with respect to point 212.

A result of the stress condition (e.g., an over temperature condition) may be that detection accuracy of the magnetoresistance element (e.g., a stress detecting magnetoresistance element), and, more importantly, detection accuracy of the IC in which the magnetoresistance element may be provided (which may include at least one first magnetic field sensing element), may be negatively impacted. As discussed, in high precision applications such as automobiles, accuracy variations in detection can be problematic.

Referring to FIG. 2A, in which like signals of FIG. 2 are shown having like reference designations, a plot 1200 includes a characteristic curve 210 representative of a first response characteristic of a magnetoresistance element, and a curve 1230 representative of a second response characteristic of a magnetoresistance element. Similar to FIG. 2, in some embodiments the magnetoresistance elements characterized by curves 210 and 1230 may be the same magnetoresistance element with the response characteristics corresponding to response characteristics of the magnetoresistance element at various points in time (e.g., first and second times) under different operating conditions (e.g., temperature and/or magnetic field strength). In other embodiments, the magnetoresistance elements may be different magnetoresistance elements. For simplicity of the discussions herein, the former (i.e., a same magnetoresistance element) will be assumed.

As illustrated, curves 210 and 1230 have different peak-to-peak ranges between saturation regions where resistance of the magnetoresistance element substantially levels off.

In the example embodiment shown, the first characteristic curve 210 corresponds to a response characteristic of a magnetoresistance element which does not have a characteristic (e.g., a response characteristic) indicative of a stress condition (e.g., exposure to a magnetic field having a strength greater than a predetermined level, or exposure to a temperature greater than a predetermined level) and the second characteristic curve 1230 corresponds to a response characteristics of a magnetoresistance element which has a characteristic indicative of a stress condition. As one example, the stress condition (e.g., a stress condition that may cause damage to the magnetoresistance element) may be detected as a change in (or a difference between) a peak-to-peak resistance range of the curves. For example, in the illustrated embodiment, curve 1230 has a peak-to-peak range which is less than the peak-to-peak range of curve 210. In one embodiment, characteristic curve 1230 may correspond to an exposure to a magnetic field having a strength greater than a predetermined level, an exposure to a temperature greater than a predetermined level, or a combination thereof.

As another example, the stress condition may be detected as a change in (or an offset between) the curves at zero magnetic field. For example, in the illustrated embodiment, the curves 210 and 1230 each have a different resistance and offset with respect to each other at zero magnetic field. In particular, the magnetoresistance element characterized by curve 1230 has a resistance which is less than the magnetoresistance element characterized by curve 210 when subjected to substantially no magnetic field. Such may, for example, be due to temperature and/or magnetic field variations experienced by the magnetoresistance element. For example, the magnetoresistance element characterized by curve 210 may correspond to a magnetoresistance element subjected to a "normal" temperature (e.g., room temperature) and magnetic field (i.e., the magnetoresistance element is not subjected to a stress condition), and the magnetoresistance element characterized by curve 1230 may correspond to a magnetoresistance element subjected to stress condition (i.e., a temperature and/or a magnetic field greater than a predetermined level).

It should be appreciated that in some embodiments each of the curve changes shown in FIGS. 2 and 2A can be the result of a temperature variation (e.g., a temperature overstress), a magnetic field strength variation (e.g., a magnetic overstress) or a combination of a temperature variation and a magnetic field strength variation. The curve changes can, for example, be dependent on the yoke construction of the magnetoresistance elements with some yoke constructions being more tolerant than others to temperature variations and/or magnetic field strength variations. In other words, the yoke constructions of the magnetoresistance elements may impact the curve changes shown in FIGS. 2 and 2A.

Figure 3:
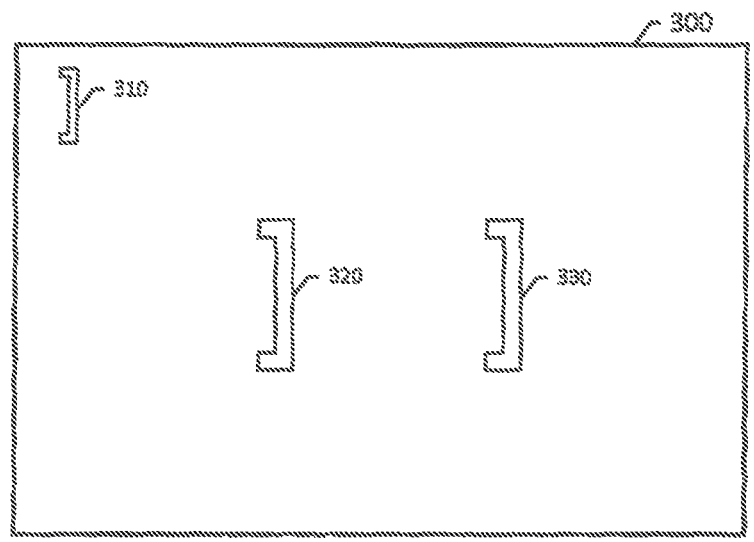
FIG. 3 shows an example integrated circuit including a stress detecting magnetoresistance element.

Referring also to FIG. 3, an example circuit as may be provided in the form of an integrated circuit (e.g., 100, shown in FIG. 1) includes a plurality of magnetoresistance elements (here, magnetoresistance elements 310, 320, 330), each of which is supported by a substrate 300 that may include one or more substrates (or sub-substrates). The substrate 300 may be a semiconductor substrate or any other material substrate that can support electrical components and be provided in the form of an integrated circuit. Additionally, the substrate 300 may include various layers including, but not limited to, diffusion layers, implant layers, metal layers, via and contact layers, etc. The circuit may also include additional circuitry (not shown), as will be discussed.

Magnetoresistance elements 320, 330 are provided as so-called "first magnetoresistance elements" (e.g., IC output signal generating magnetoresistance elements) and magnetoresistance element 310 is provided as a so-called "second magnetoresistance element" (e.g., a stress detecting magnetoresistance element) in the illustrated embodiment. The first magnetoresistance elements 320, 330 (e.g., GMR yokes or yoke structures), which may be the same as or similar to the first magnetic field sensing elements 140 of FIG. 1, are disposed on a substantially central portion (or surface) of the substrate 300. The first magnetoresistance elements 320, 330 are configured to provide an output signal of the circuit in response to a detected magnetic field (e.g., a magnetic field as may be generated by object 120 of FIG. 1).

Additionally, the second magnetoresistance element 310 (e.g., a GMR yoke or yoke structure), which may be the same as or similar to the second magnetic field sensing elements 182 of FIG. 1 and may have same or different physical dimensions as the first magnetoresistance elements 320, 330, is disposed on the top left corner (or surface) of the substrate 300. The second magnetoresistance element 310 is configured to detect a stress condition (e.g., an over temperature condition and/or an exposure to a magnetic field strength greater than a predetermined level). The detected stress condition may be indicative of a stress condition associated with at least one of the substrate 300 and the first magnetoresistance elements 320, 330. In particular, the second magnetoresistance element 310 may be used to detect levels of stress which could damage at least one of the substrate 300 or the first magnetoresistance elements 320, 330 (i.e., the main sensor yokes). The second magnetoresistance element 310 may also be used to detect levels of stress in the circuit established by predetermined specified limits of the element 310.

In one embodiment, the second magnetoresistance element 310 is decoupled from active circuitry within the IC, and is provided as an IC "package stress indicator device" (e.g., similar to a shipping package drop indicator device which indicates whether a package has received a shock exceeding a predetermined force). During or after shipment or use of the circuit (e.g., upon return to the manufacturer in response to a field failure), the second magnetoresistance element 310 can be exercised and its performances evaluated for the exposure to stress conditions. For example, a known magnetic field can be applied to the IC and test points probed to determine a characteristic curve of the element 310. Any changes in performance, as may be determined by variations in an expected or baseline characteristic curve to the curves shown in FIG. 2 or 2A, for example, can then be correlated versus a predetermined stress matrix (e.g., a matrix containing datasheet limits) to detect a stress condition.

In another embodiment, the second magnetoresistance element 310 is coupled to active circuitry within the IC of FIG. 3. The active circuitry can be coupled to receive and/or measure an output (or characteristic) of the second magnetoresistance element 310 and provide an indicator of a stress condition, if present. As examples, the circuit may provide an indicator of the stress condition, such as in the form of a signal having a level indicative of the stress condition. The signal may be stored in a memory device (e.g., EEPROM) and/or the stress condition may be conveyed in various formats and/or protocols. As one example, the stress condition may be conveyed in the form of a pulse width of an output signal of the IC. Furthermore, such indicator(s) may be provided to various circuitry that may respond to the stress condition by initiating or terminating various actions. As one example, some circuits employ fuses that are blown during manufacture for various purposes, such as altering configurations or signal protocols. In this example, the fuses may be blown in response to receiving an indicator of a stress condition.

Receipt or measurement of the output (or characteristic) of the second magnetoresistance element 310 by active circuitry may occur, for example, on power-up of the circuit, or on a timed schedule during operation of the circuit. The indicator of the stress condition, if present, could be included in a standard output protocol, for example a SENT type protocol, or could be provided on a dedicated output pin, or through any other means to output the information, such as those means (e.g., visual indicator) described above.

Figure 3A:
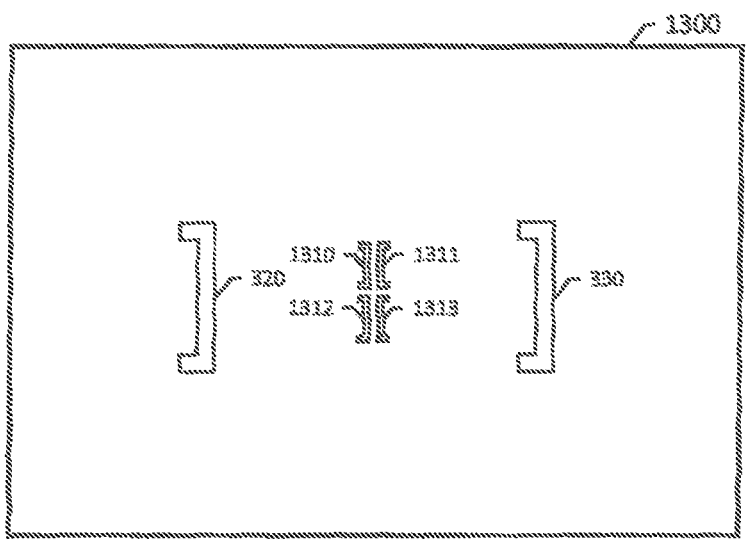
FIG. 3A shows an example integrated circuit including a plurality of stress detecting magnetoresistance elements.

Referring now to FIG. 3A, in which like elements of FIG. 3 are provided having like reference designations, another example circuit as may be provided in the form of an integrated circuit is shown. The circuit includes first magnetoresistance elements 320, 330, and second magnetoresistance elements 1310, 1311, 1312, 1313, all supported by the substrate 1300. The substrate 1300 may be the same as or similar to substrate 300 of FIG. 3.

Similar to first magnetoresistance elements 320, 330 of FIG. 3, the first magnetoresistance elements 320, 330 of FIG. 3A are disposed on a substantially central portion (or surface) of the substrate 1300 and are configured to provide an output signal of the circuit in response to a detected magnetic field. The second magnetoresistance elements 1310, 1311, 1312, 1313, which may be the same as or similar to the second magnetoresistance element 310 of FIG. 3, are disposed between magnetoresistance element 320 and magnetoresistance element 330 in the illustrated embodiment, and are configured to have a characteristic indicative of a stress condition. In one embodiment, the second magnetoresistance elements 1310, 1311, 1312, 1313 are coupled in a bridge (e.g., Wheatstone bridge) configuration. Other configurations of the second magnetoresistance elements 1310, 1311, 1312, 1313 are, of course, possible. Similar to second magnetoresistance element 310 of FIG. 3, the second magnetoresistance elements 1310, 1311, 1312, 1313 may be used to detect a stress condition associated with at least one of the substrate 1300 and/or the first magnetoresistance elements 320, 330.

In one aspect of the concepts, systems, circuits and techniques sought to be protected herein, physical placement of the second magnetoresistance elements (here, elements 1310, 1311, 1312, 1313) with respect to the first magnetoresistance elements (here, elements 320, 330) may impact how closely a detected stress condition associated with the second magnetoresistance elements reflects a stress condition of the first magnetoresistance elements. In one embodiment, the closer the second magnetoresistance elements are to the first magnetoresistance elements, the more closely the stress of the second magnetoresistance elements will reflect stress of the first magnetoresistance elements. Alternatively or additionally, how closely a detected stress condition associated with the second magnetoresistance elements reflects a stress condition associated with the first magnetoresistance elements could be a function of design (e.g., a change in the layers and/or physical dimensions) of the second elements with respect to the first elements. For example, the second magnetoresistance elements may be designed to detect a stress condition before the first magnetoresistance elements experiences a stress condition.

While the circuits of FIGS. 3 and 3A are shown as including a certain number of second magnetoresistance elements with the second magnetoresistance elements positioned in a particular manner, it should be appreciated these circuits illustrate but several of many potential configurations of second magnetoresistance elements. The circuits may, of course, be implemented using more than or less than the number of second magnetoresistance elements shown, and the second magnetoresistance elements may be positioned in other manners than that which is shown.

Additionally, while the first and second magnetoresistance elements of FIGS. 3 and 3A are shown coupled to a same semiconductor substrate, it should be appreciated that in some embodiments the first and second magnetoresistance elements may be supported by separate substrates. For example, the first magnetoresistance elements can be supported by a first substrate and the second magnetoresistance elements can be supported by a second, different substrate. The second substrate may, for example, be provided capable of coupling and decoupling from the first substrate such that after field used, the second substrate can be decoupled from the first substrate and the second magnetoresistance elements analyzed for stress conditions.

Referring to FIGS. 4-4D, example stress detection circuitry (e.g., 480, shown in FIG. 4) as may be provided on an integrated circuit such as the integrated circuit 100 of FIG. 1 are shown. In contrast to some embodiments described above, the stress detection magnetoresistance elements of FIGS. 4-4D, which may be the same as or similar to stress detection circuitry 180 of FIG. 1, for example, may be coupled to active circuitry within the integrated circuit (referred to alternatively as a monitor circuit). In order to detect a stress condition, the stress detecting circuitry is either exercised by applying a known magnetic field (i.e., an applied magnetic field) and evaluating the response characteristic to determine if the expected predetermined characteristic occurs (FIGS. 4 and 4C) or the stress detecting circuitry is coupled to circuitry having a known response and evaluating the circuitry to determine if the expected known response occurs in response to a detected magnetic field (FIGS. 4A, 4B and 4D). It should be appreciated that the example stress detection circuitry described below are but several of many potential configurations of stress detection circuitry in accordance with the concepts, systems, circuits and techniques described herein.

Referring to FIG. 4, example stress detection circuitry 480 is supported by at least one substrate and includes a magnetoresistance element 482 (e.g., a GMR element), a monitor circuit 484, and a first current source 486. The stress detection circuitry 480 also includes a current trace 487 and a second current source 488 in the illustrated embodiment. The magnetoresistance element 482, which may be the same as or similar to the at least one second magnetoresistance element (e.g., a stress detecting magnetoresistance element) described in the figures above, has a first terminal coupled to the current source 488 and a second opposing terminal coupled to a second terminal 402 of the stress detection circuitry 480. Second current source 488 (e.g., a constant or variable current source) is disposed in a signal path between a first terminal 401 of the stress detection circuitry 480 and the first terminal of magnetoresistance element 482. Additionally, the monitor circuit 484 has an input coupled to a node N between the first and second terminals 401, 402 of the stress detection circuitry 480, and an output coupled to an output of the stress detection circuitry 480. Further, current source 486 (e.g., a constant or variable current source) is coupled to conductive trace 487 to form a circuit for producing a predetermined applied magnetic field, as will be discussed. Although not shown, conductive trace 487 may comprise a plurality of conductive traces coupled in parallel.

The magnetoresistance element 482, which may be used, for example, to detect levels of stress which could damage the at least one substrate and/or the first magnetoresistance elements (e.g., the main sensor yokes) provided within the same integrated circuit as the magnetoresistance element 482 (and the stress detection circuitry 480), is driven by the second current source 488. The second current source 488 is coupled to a supply voltage, denoted as VCC at the first terminal 401 of the stress detection circuitry 480, as may be received from a power supply (not shown), and is configured to drive the magnetoresistance element 482 with a corresponding current signal. The magnetoresistance element 482 is configured to have a characteristic (e.g., a characteristic resistance) indicative of a stress condition which may be at least one of an over temperature condition or an exposure to a magnetic field strength greater than a predetermined level. Changes in a magnetic field experienced by the magnetoresistance element 482, which may be an applied magnetic field, may cause the resistance of the magnetoresistance element 482 to change. Additionally, in some embodiments, changes in temperature experienced by the magnetoresistance element 482 may also cause resistance of the magnetoresistance element 482 to change. As the resistance of the magnetoresistance element 482 changes, a voltage at node N (i.e., 482a) also changes.

The conductive trace 487, which may be a wire, a coil, or any form of conductor that can produce a magnetic field when a current flows through the conductor, is coupled to receive a current signal 486a generated by the current source 486 and configured to produce an applied magnetic field. The applied magnetic field may have sufficient strength, for example, to affect resistance of the magnetoresistance element 482 and bias magnetoresistance element 482 to a predetermined and/or constant resistive value, as described in co-pending U.S. patent application Ser. No. 14/556,523 entitled "Magnetoresistance Elements With Biasing Magnetic Source," which is assigned to the Assignee of the present disclosure and incorporated herein by reference in its entirety.

The applied magnetic field may also be generated to test for any changes in response (e.g., a response characteristic) of the magnetoresistance element 482 from a predetermined response. Changes in response may, for example, be indicative of a stress condition.

In the illustrated embodiment, the conductive trace 487 is disposed proximate to magnetoresistance element 482. As shown in FIG. 4, for example, magnetoresistance element 482 may be formed over conductive trace 487 or conductive trace 487 may be formed over magnetoresistance element 482. In other embodiments, magnetoresistance element 482 and conductive trace 487 may be on opposite sides of the at least one substrate as the stress detection circuitry 480 or may be otherwise adjacent or proximate to each other. Magnetoresistance element 482 and conductive trace 487 would be separated by an insulating layer, such as an oxide, nitride, or polymer layer, or the like.

The monitor circuit 484, which may be the same as or similar to stress detector 184 described above in conjunction with FIG. 1, for example, is configured to monitor a characteristic (e.g., a response characteristic) of the magnetoresistance element 482 and detect a stress condition. The monitor circuit 484 includes a comparator 485 in the illustrated embodiment. The comparator 485, which may be powered by the supply voltage received at first terminal 401 of the stress detection circuitry 480, is coupled to receive a voltage 482a associated with the node N (e.g., a level-shifted voltage) at a first comparator input (e.g., a non-inverting input). The comparator 485 is also coupled to receive a reference signal (e.g., a ground non-zero reference voltage) at a second comparator input (e.g., an inverting input) and is configured to generate a comparison signal 484a in response to the first comparator input and the second comparator input. The comparison signal 484a, which corresponds to an output signal of the stress detection circuitry 480 in the illustrated embodiment, may be indicative of the stress condition.

As one example, the comparison signal 484a may have edges occurring in response to a comparison of the first comparator input and the second comparator input, and the edges may be indicative of the stress condition. In the embodiment shown in FIG. 4, for example, when the voltage of signal 482a at the first comparator input is greater than the voltage at the second comparator input, the comparison signal 484a is at a logic high level and when the voltage at the first comparator input is less than the voltage at the second comparator input, the comparison signal 484a is at a logic low level. In some embodiments, the comparator 485 has hysteresis.

Additionally, in some embodiments, the output of stress detection circuitry 480 (here, comparison signal 484a) may be received at an input of circuitry (e.g., controller 170) for further processing (e.g., to detect and/or provide an indication of a stress condition). A controller may, for example, be configured to poll (i.e., sample) stress detection circuitry 480 and use data obtained from the polling to determine if a stress condition (or failure) has occurred, as described above in conjunction with FIG. 1. A result of the determination, as may have a corresponding stress condition or failure code, may be saved in a memory device (e.g., 160, shown in FIG. 1), provided in a controller output signal (e.g., 170a, shown in FIG. 1), and/or displayed on a visual indicator (e.g., LED) as a few examples.

Referring now to FIG. 4A, in which like elements of FIG. 4 are provided having like reference designations, stress detection circuitry 1480 in accordance with another embodiment includes magnetoresistance element 482 (e.g., a stress detecting magnetoresistance element) and monitor circuit 484. The stress detection circuitry 1480 also includes a resistor 1482 in the illustrated embodiment. The resistor 1482 and the magnetoresistance element 482 form a resistor divider which is coupled between the first and second terminals 401, 402 of the stress detection circuitry 1480. The resistance value of the resistor 1482 can be, for example, chosen based on a voltage level associated with the supply voltage, denoted as VCC, and/or a predetermined range of voltages of the supply voltage.

Comparator 485 of the monitor circuit 484 is coupled to receive a voltage 1482a associated with a node formed between resistor 1482 and magnetoresistance element 482 of the resistor divider (e.g., a level shifted voltage) at a first comparator input (e.g., non-inverting input). The comparator 485 is also coupled to receive a reference signal (e.g., a ground reference signal) at a second comparator input (e.g., inverting input) and configured to generate a comparison signal 1484a in response to the first comparator input and the second comparator input. Similar to comparison signal 484a of FIG. 4, comparison signal 1484a may be indicative of a stress condition.

The magnetoresistance element 482 is designed to have a predetermined characteristic curve. If the magnetoresistance element 482 experiences a stress condition, its predetermined characteristic curve may vary and this variation used to detect the stress condition (e.g., through comparison signal 1484a). For example, the reference signal may be selected such that when the magnetoresistance element 482 has not experienced a stress condition, the comparison signal 1484a is provided at a first logic level, whereas once a stress condition occurs, the change on the characteristic curve (e.g., the resistance) of magnetoresistance element 482 causes the comparison signal 1484a to transition to a second logic level.

Referring now to FIG. 4B, stress detection circuitry 2480 in accordance with another embodiment includes magnetoresistance element 482 and monitor circuit 484. The stress detection circuitry 1480 also includes additional magnetoresistance elements 482', 482", 482''' and amplifier 483 in the illustrated embodiment. Magnetoresistance elements 482, 482', 482". 482''', which may be the same as or similar to each other in some embodiments, and may be provided as stress detecting magnetoresistance elements, are coupled in a bridge configuration (e.g., a Wheatstone bridge configuration), as denoted by reference numeral 2481. The bridge configuration 2481 has a first terminal coupled to first terminal 401 of stress detection circuitry 2480, and a second opposing terminal coupled to second terminal 402 of stress detection circuitry 2480.

Amplifier 483, which may be provided as a differential amplifier is coupled to receive a first output voltage 2482*a* generated at a first voltage node of the bridge configuration 2481 at a first amplifier input (e.g., non-inverting input) and a second output voltage 2482*b* generated at a second voltage node of the bridge configuration 2481 at a second amplifier input (e.g., an inverting input). The amplifier 483 is configured to generate an amplifier output signal 2483*a* indicative of a voltage difference between the first output voltage 2484*a* and the second output voltage 2482*b*. Amplifier output signal 2483*a* may also be indicative of a stress condition.

As the resistance of the magnetoresistance elements 482, 482', 482", 482'" change in response to a detected magnetic field as may be produced by motion of an object (e.g., 120, shown in FIG. 1), for example, at least one of the first output voltage 2482*a* and the second output voltage 2482*b* may also change. The changes in the first output voltage 2482*a* and/or the second output voltage 2482*b* may be used to detect a stress condition (e.g., through comparison signal 2484*a*, as will be discussed). In other words, a predetermined output signal is detected based on motion of the object and changes in the output signal may be used to detect a stress condition.

Comparator 485 of the monitor circuit 484 is coupled to receive amplifier output signal 2483*a* at a first comparator input (e.g., non-inverting input) and a reference signal at a second comparator input (e.g., inverting input). The comparator 485 is configured to generate a comparison signal 2484*a* in response to the first comparator input and the second comparator input. The comparison signal 2484*a* may be indicative of a stress condition.

In some embodiments, magnetoresistance elements 482, 482', 482", 482'" may have a temperature coefficient (i.e., a temperature coefficient of resistance when subject to no magnetic field) that is substantially the same. Such may ensure that the magnetoresistance elements 482, 482', 482", 482'" respond in a same or similar manner to changes in temperature. Additionally, in some embodiments, amplifier 483 may be provided as part of monitor circuit 484.

Referring now to FIG. 4C, in which like elements of FIG. 4B are provided having like reference designations, stress detection circuitry 3480 in accordance with another embodiment includes bridge configuration 2481, amplifier 483 and monitor circuit 484. The stress detection circuitry 3480 also includes a current source 3486 and a current trace 3487 in the illustrated embodiment. The conductive trace 3487, which may be the same as or similar to conductive trace 487 of FIG. 4, is disposed proximate to (here, over or below) the magnetoresistance elements of the bridge configuration 2481 (i.e., magnetoresistance elements 482, 482', 482", 482'"). In some embodiments, the conductive trace 3487 is disposed proximate to only select ones of the magnetoresistance elements magnetoresistance elements 482, 482', 482", 482'".

The conductive trace 3487 is coupled to receive a current signal 3486*a* generated by current source 3486 and configured to produce an applied magnetic field. Similar to the applied magnetic field described above in conjunction with FIG. 4, the applied magnetic field produced by conductive trace 3487 in combination with current source 3486 may have sufficient strength to affect resistance of and/or bias one or more of the magnetoresistance elements 482, 482', 482", 482'" (e.g., to provide temperature compensation to stress detection circuitry 3480).

Amplifier 483 is coupled to receive a first output voltage 3482*a* generated at a first voltage node of the bridge configuration 2481 at a first amplifier input (e.g., non-inverting input) and a second output voltage 3482*b* generated at a second voltage node of the bridge configuration 2481 at a second amplifier input (e.g., inverting input). The amplifier 483 is configured to generate an amplifier output signal 3483*a* indicative of a voltage difference between the first output voltage and the second output voltage.

Comparator 485 is coupled to receive amplifier output signal 3483*a* at a first comparator input (e.g., non-inverting input) and a reference signal (e.g., a ground reference signal) at a second comparator input (e.g., inverting input). The comparator 485 is configured to generate a comparison signal 3484*a* in response to the first comparator input and the second comparator input. The comparison signal 3484*a* may be indicative of a stress condition.

Referring now to FIG. 4D, another example implementation of stress detection circuitry 4480 as may be provided in an integrated circuit is shown. The stress detection circuitry 4480 is similar to the stress detection circuitry 2480 described above in conjunction with FIG. 4B. Here, however, stress detection circuitry 4480 includes a current source 4486 disposed in a signal path between the first terminal 401, and a first terminal of a bridge configuration 4481. Additionally, magnetoresistance elements 482' and 482" of bridge configuration 2481 of FIG. 4B are replaced with magnetoresistance elements 4482 and 4482' to form the bridge configuration 4481. Unlike magnetoresistance elements 482' and 482", magnetoresistance elements 4482 and 4482' are substantially insensitive (e.g., non-responsive) to a magnetic field.

Magnetoresistance elements 4482 and 4482' may be substantially insensitive to a magnetic field due to the magnetoresistance elements 4482 and 4482' having been intentionally damaged (e.g., by thermal processing), or the magnetoresistance elements 4482 and 4482' including one or more shielding materials. One example magnetoresistance element which is insensitive to a magnetic field is described in U.S. Pat. No. 7,777,607 entitled "Resistor Having A Predetermined Temperature Coefficient," which is assigned to the Assignee of the present disclosure and incorporated herein by reference in its entirety.

The current source 4486, which may be the same as or similar to second current source 488 of FIG. 1, is coupled to receive the supply voltage, denoted as VCC at the first terminal 401 of the stress detection circuitry 4480, and is configured to drive the bridge configuration 4481 with a corresponding current signal. The magnitude of the current signal generated by second current source 4486 may be adjusted to bias one or more of the magnetoresistance elements 482 and 482'".

Magnetoresistance elements 482 and 482'" of the bridge configuration 4481 are responsive to a detected magnetic field to generate a first output voltage 4482*a* at a first voltage node of the bridge configuration 4481 and a second output voltage 4482*b* at a second voltage node of the bridge configuration 4481. Since magnetoresistance elements 482 and 482'" are on opposite "arms" of the bridge configuration 4481, changes in the first output voltage 4482*a* and the second output voltage 4482*b* will be opposite to each other in response to changes in the external magnetic field. For example, if the strength of the external magnetic field increases, the resistance of magnetoresistance elements 482 and 482''' may increase, causing the first output voltage 4482a to increase and the second output voltage 4482b to decrease. This behavior may be used to detect a stress condition (e.g., through comparison signal 4484a, as will be discussed).

Amplifier 483 is coupled to receive the first output voltage 4482a at a first amplifier input (e.g., non-inverting input) and the second output voltage 4482b at a second amplifier input (e.g., inverting input). The amplifier 483 is configured to generate an amplifier output signal 4483a indicative of a voltage difference between the first output voltage 4482a and the second output voltage 4482b, and indicative of changes in resistance of magnetoresistance elements 482 and 482'''.

Comparator 485 is coupled to receive amplifier output signal 4483a at a first comparator input (e.g., non-inverting input) and a reference signal (e.g., a ground reference signal) at a second comparator input (e.g., inverting input). The comparator 485 is configured to generate a comparison signal 4484a indicative of a stress condition.

In one embodiment, magnetoresistance elements 4482 and 4482' may be used to provide temperature compensation (and stability) to the stress detection circuitry 4480. As one example, the magnetoresistance elements 4482 and 4482' may be biased to a constant resistive value to compensate for temperature changes experienced by one or more of the magnetoresistance elements (e.g., 482, 482''') in the stress detection circuitry 4480. Other temperature compensation techniques may also be found suitable including, for example, the bridge configuration 4481 being driven to a substantially constant resistance by current source 4481.

As described above and will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application but rather, may be useful in substantially any application where it is desired to detect a stress condition (e.g., an over temperature condition or an exposure to a magnetic field strength greater than a predetermined level) of an IC.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. An integrated circuit comprising:
   at least one first magnetic field sensing element comprising at least one first magnetoresistance element configured to provide an output signal of the integrated circuit in response to a detected magnetic field; and
   at least one second magnetic field sensing element comprising at least one second magnetoresistance element configured to have a characteristic indicative of a stress condition associated with the at least one first magnetic field sensing element.

2. The integrated circuit of claim 1, wherein the at least one first magnetoresistance element is supported by a same semiconductor substrate as the at least one second magnetoresistance element.

3. The integrated circuit of claim 1, wherein the at least one first magnetoresistance element is supported by a different semiconductor substrate than the at least one second magnetoresistance element.

4. The integrated circuit of claim 1, wherein a first resistance of the at least one second magnetoresistance element measured at a first time is compared to a second resistance of the at least one second magnetoresistance element measured at a second time to detect the stress condition.

5. The integrated circuit of claim 1, wherein a first resistance of the at least one second magnetoresistance element measured at a first time is compared to a baseline resistance associated with the at least one second magnetoresistance element to detect the stress condition.

6. The integrated circuit of claim 1, wherein the at least one second magnetoresistance element is provided in a resistor divider.

7. The integrated circuit of claim 6, further comprising:
   a comparator responsive to a node of the resistor divider and to a reference signal to generate a comparison signal indicative of the stress condition.

8. The integrated circuit of claim 1, wherein the stress condition is at least one of an over temperature condition or an exposure to a magnetic field greater than a predetermined level.

9. The integrated circuit of claim 8, wherein the stress condition is detected as at least one of an offset or a change in a peak-to-peak range of a characteristic curve associated with the at least one second magnetoresistance element.

10. The integrated circuit of claim 1, wherein the at least one second magnetoresistance element comprises a plurality of magnetoresistance elements coupled in a bridge configuration.

11. The integrated circuit of claim 10, further comprising:
    an amplifier responsive to a first output voltage generated at a first voltage node of the bridge configuration and to a second output voltage generated at a second voltage node of the bridge configuration to generate an output signal indicative of a voltage difference between the first output voltage and the second output voltage, wherein the first and second output voltages change in response to a magnetic field; and
    a comparator responsive to the output signal of the amplifier and a reference signal to generate a comparison signal indicative of the stress condition.

12. The integrated circuit of claim 11, further comprising:
    a current source; and
    a conductive trace disposed proximate to one or more of the plurality of magnetoresistance elements, the conductive trace configured to carry a current signal generated by the current source to provide the magnetic field.

13. The integrated circuit of claim 11, wherein one or more of the plurality of magnetoresistance elements is insensitive to the magnetic field.

14. The integrated circuit of claim 10, wherein the plurality of magnetoresistance elements have a temperature coefficient that is substantially the same.

15. The integrated circuit of claim 1, wherein the at least one first magnetic field sensing element further comprises at least one Hall effect element.

16. The integrated circuit of claim 1, wherein the at least one second magnetoresistance element comprises one or more of a giant magnetoresistance (GMR) element, an anisotropic magnetoresistance (AMR) element, a magnetic tunnel junction (MTJ) element and a tunneling magnetoresistance (TMR) element.

17. A method for detecting a stress condition in an integrated circuit, the method comprising:
    providing at least one first magnetic field sensing element comprising at least one first magnetoresistance element configured to provide an output signal of the integrated circuit in response to a detected magnetic field;
    providing at least one second magnetic field sensing element comprising at least one second magnetoresistance element; and
    detecting the stress condition associated with the at least one first magnetic field sensing element based on a characteristic of the at least one second magnetoresistance element.

18. The method of claim 17, wherein detecting the stress condition comprises:
    measuring a first resistance of the at least one second magnetoresistance element at a first time;
    measuring a second resistance of the at least one second magnetoresistance element at a second time; and
    comparing the first resistance with the second resistance to detect the stress condition.

19. The method of claim 17, wherein detecting the stress condition comprises:
    measuring a first resistance of the at least one second magnetoresistance element at a first time; and
    comparing the first resistance with a baseline resistance associated with the at least one second magnetoresistance element to detect the stress condition.

20. The method of claim 17, wherein providing at least one second magnetic field sensing element comprises:
    providing a plurality of magnetoresistance elements coupled in a bridge configuration;
    receiving a first output voltage generated at a first voltage node of the bridge configuration;
    receiving a second output voltage generated at a second voltage node of the bridge configuration;
    generating an amplifier output signal indicative of a voltage difference between the first and second output voltages, wherein the first and second output voltages change in response to the magnetic field; and
    generating a comparison signal indicative of the stress condition in response a comparison of the amplifier output signal and a reference signal.

21. The method of claim 20, wherein providing a plurality of magnetoresistance elements comprises:
    providing at least one magnetoresistance element with a resistance that does not vary with magnetic field.

22. The method of claim 20, further comprising:
    providing a conductive trace to generate the magnetic field.

23. An integrated circuit comprising:
    at least one first magnetic field sensing element comprising at least one first magnetoresistance element configured to provide an output signal of the integrated circuit in response to a detected magnetic field;
    at least one second magnetic field sensing element comprising at least one second magnetoresistance element; and
    means for detecting a stress condition associated with the at least one first magnetic field sensing element based on a characteristic of the at least one second magnetoresistance element.

24. The integrated circuit of claim 23, wherein the stress condition is detected as at least one of an offset or a change in a peak-to-peak range of a characteristic curve associated with the at least one second magnetoresistance element.

* * * * *

UNITED STATES PATENT AND TRADEMARK OFFICE
CERTIFICATE OF CORRECTION

PATENT NO. : 9,910,087 B2
APPLICATION NO. : 15/068775
DATED : March 6, 2018
INVENTOR(S) : Jeffrey Eagen et al.

It is certified that error appears in the above-identified patent and that said Letters Patent is hereby corrected as shown below:

In the Specification

Column 1, Line 43, delete "and or" and replace with --and/or--.

Column 2, Line 27, delete "indictors" and replace with --indicators--.

Column 18, Line 62, delete "482"." and replace with --482",--.

In the Claims

Column 23, Line 1, delete "claim 10" and replace with --claim 1--.

Column 23, Lines 1 to 3, delete "wherein the plurality of magnetoresistance elements have a temperature coefficient that is substantially the same." and replace with --wherein the at least one first magnetic field sensing element further comprises at least one Hall effect element.--.

Column 23, Lines 4 to 6, delete "The integrated circuit of claim 1, wherein the at least one first magnetic field sensing element further comprises at least one Hall effect element." and replace with --The integrated circuit of claim 1, wherein the at least one second magnetoresistance element comprises one or more of a giant magnetoresistance (GMR) element, an anisotropic magnetoresistance (AMR) element, a magnetic tunnel junction (MTJ) element and a tunneling magnetoresistance (TMR) element.--.

Column 23, Lines 7 to 12, delete "The integrated circuit of claim 1, wherein the at least one second magnetoresistance element comprises one or more of a giant magnetoresistance (GMR) element, an anistropic magnetoresistance (AMR) element, a magnetic tunnel junction (MTJ) element and a tunneling magnetoresistance (TMR) element." and replace with --The integrated circuit of claim 10, wherein the plurality of magnetoresistance elements have a temperature coefficient that is substantially the same.--.

Signed and Sealed this
Fifth Day of March, 2019

Andrei Iancu
*Director of the United States Patent and Trademark Office*